(12) United States Patent
Komai

(10) Patent No.: US 9,006,561 B2
(45) Date of Patent: Apr. 14, 2015

(54) COLLECTOR SHEET FOR SOLAR CELL

(75) Inventor: Takayuki Komai, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 174 days.

(21) Appl. No.: 13/521,657

(22) PCT Filed: Jan. 5, 2011

(86) PCT No.: PCT/JP2011/050025
§ 371 (c)(1),
(2), (4) Date: Aug. 9, 2012

(87) PCT Pub. No.: WO2011/083790
PCT Pub. Date: Jul. 14, 2011

(65) Prior Publication Data
US 2012/0305058 A1    Dec. 6, 2012

(30) Foreign Application Priority Data

Jan. 6, 2010 (JP) ................................ 2010-000908

(51) Int. Cl.
*H01L 31/00* (2006.01)
*H01B 13/00* (2006.01)
(Continued)

(52) U.S. Cl.
CPC .............. *H01L 31/0516* (2013.01); *Y02E 10/50* (2013.01); *B32B 15/08* (2013.01); *B32B 27/36* (2013.01); *B32B 2307/202* (2013.01)

(58) Field of Classification Search
CPC ...................... H01L 2924/07; H01L 31/02013; H01L 31/0224; H01L 31/0392; H01L 31/0516
USPC ....................... 136/252; 174/250, 258; 216/13
See application file for complete search history.

(56) References Cited

U.S. PATENT DOCUMENTS

2006/0162770 A1* 7/2006 Matsui et al. ................. 136/263
2007/0251570 A1* 11/2007 Eckert et al. .................. 136/256
(Continued)

FOREIGN PATENT DOCUMENTS

CN       102077361 A    5/2011
EP        2302692 A1    3/2011
(Continued)

OTHER PUBLICATIONS

Yokoyama Machine Translation.*
(Continued)

*Primary Examiner* — Jonathan Johnson
*Assistant Examiner* — Angelo Trivisonno
(74) *Attorney, Agent, or Firm* — Locke Lord LLP; Jeffrey D. Hsi; Daniel J. Fiorello

(57) ABSTRACT

Disclosed is a resin wiring sheet wherein generation of wrinkles due to heat treatment can be suppressed. The wiring sheet (1) has wiring (3) formed thereon by laminating a metal foil on the surface of a resin base material (2) and patterning the metal foil into a desired wiring shape. The resin base material (2) is a biaxially stretched sheet, which is stretched in the TD direction and the MD direction of the biaxially extending apparatus. In the wiring (3) formed on the wiring sheet (1), with respect to the components in the two directions that orthogonally intersect each other, the total length of the wiring (3) components in one direction is longer than the total length of the wiring (3) components in the other direction, thus the wiring has anisotropy, and said direction of the components accords with the MD direction of the stretched resin base material (2).

4 Claims, 3 Drawing Sheets

(51) Int. Cl.
*H05K 1/00* (2006.01)
*H01L 31/05* (2014.01)
*B32B 15/08* (2006.01)
*B32B 27/36* (2006.01)

(56) References Cited

U.S. PATENT DOCUMENTS

2009/0139564 A1* 6/2009 Miyaji et al. ............ 136/251
2010/0018565 A1* 1/2010 Funakoshi ............... 136/244
2011/0094562 A1 4/2011 Funakoshi

FOREIGN PATENT DOCUMENTS

| | | |
|---|---|---|
| JP | 62-84568 | 4/1987 |
| JP | 2007-081237 A | 3/2007 |
| JP | 2007-281071 A | 10/2007 |
| JP | 2009-045888 A | 3/2009 |
| JP | 2009-188391 A | 8/2009 |
| JP | 2010016074 A | 1/2010 |
| WO | WO 2008090718 A1 * | 7/2008 |

OTHER PUBLICATIONS

International Search Report of PCT/JP2011/050025.

\* cited by examiner

COLLECTOR SHEET FOR SOLAR CELL

CROSS REFERENCE TO RELATED APPLICATIONS

This application is the national phase under 35 U.S.C. §371 of PCT International Application No. PCT/JP2011/050025, filed Jan. 5, 2011, which claims the benefit of Japanese Patent Application No. 2010-000908, filed Jan. 6, 2010, the entire contents of the aforementioned applications are hereby incorporated herein by reference.

TECHNICAL FIELD

The present invention relates to collector sheets for solar cells, and more particularly, relates to a collector sheet for solar cells that includes wiring formed by laminating metal foil on a surface of a sheet-like resin base material and then patterning the metal foil into a desired wiring shape.

BACKGROUND ART

With a rise in awareness of environmental problems, solar batteries have been receiving attention as a clean energy source in recent years. In general, solar cell modules each constituting a solar battery have a structure in which a transparent front substrate, a surface-side sealer sheet, a solar cell, an undersurface-side sealer sheet, and an undersurface protecting sheet are laminated in order when viewed from the side of a light-receiving surface, and have the function of generating electricity from sunlight incident on the solar cell.

With solar cells that generate electricity within solar cell modules, generally, a plurality of solar cells are provided within a solar cell module, and configured to generate necessary voltage and current by being connected in series and in parallel. To wire the plurality of the solar cells within the solar cell module, a collector sheet for solar cells, for example, is used which is made by laminating metal foil to be patterned as wiring on a surface of a base material, i.e., a resin sheet (see Patent Document 1). Then the metal foil as the wiring provided on the collector sheet for solar cells and the output electrodes of the solar cells are electrically joined together by soldering.

To provide the wiring on the surface of the resin sheet as the base material for the collector sheet for solar cells, the same method as that used to make printed wiring boards, for example, can be used; that is, the metal foil is laminated on the whole surface of the base material to begin with, and then etched into a desired wiring pattern by photolithography.

Patent Document 1: Japanese Unexamined Patent Application Publication No. 2007-081237

DISCLOSURE OF THE INVENTION

Problems to be Solved by the Invention

In general, when joining wiring on a collector sheet for solar cells and the output electrode of a solar cell by soldering, solder is adhered onto the wiring on the collector sheet for solar cells beforehand, the solar cell is superposed on the wiring, and then the collector sheet for solar cells is heated. Through the heating, the solder adhering to the wiring melts and flows, following which the molten solder adheres to the output electrode of the solar cell. When having stopped the heating of the collector sheet for solar cells after that, the molten solder solidifies between the output electrode of the solar cell and the wiring on the collector sheet for solar cells. As a result, the output electrode of the solar cell and the wiring on the collector sheet for solar cells are electrically joined together.

Since collector sheets for solar cells are heated from the necessity of melting solder as described above, the collector sheets are made of a heat-resistant and strong material. As one example of such a material, a sheet made by biaxially stretching a heat-resistant resin is preferably used.

With biaxially stretched sheets, however, there is a difference in degree of stretching between a TD direction (a crosswise direction) and a MD direction (a lengthwise direction) at the time of the biaxial stretching in general, and thus a difference in heat shrinkage factor is sometimes caused between the TD direction and the MD direction at the time of heating. This comes to the surface in a form that there is a difference in heat shrinkage factor between the length and width of collector sheet for solar cells. Therefore, when having joined a solar cell and a collector sheet for solar cells by soldering, the collector sheet for solar cells shrinks lengthwise or widthwise considerably by the application of heat, and this leads to occurrence of wrinkles in the direction of the length or width of the collector sheet for solar cells joined to the solar cell. The occurrence of the wrinkles in the collector sheet for solar cells joined to the solar cell causes the application of an unforeseen stress to the solar cell after the modularization of the solar cell, and is, therefore, not preferred from the view point of the life of the solar cell module.

The present invention has been accomplished in view of such circumstances. Thus, an object of the present invention is to provide a resin collector sheet for solar cells in which occurrence of wrinkles can be prevented despite application of heat during soldering.

Means for Solving the Problems

The present inventors conducted extensive studies in order to solve the foregoing problems. As a result, they found that by forming anisotropic wiring on a collector sheet for solar cells such that an orientation of the anisotropic wiring agrees with a particular orientation of a biaxially stretched resin sheet, occurrence of wrinkles in the collector sheet for solar cells can be prevented despite application of heat during soldering. The present invention has been accomplished based on such findings.

(1) That is, the present invention is a collector sheet for solar cells in which wiring is formed by laminating metal foil on a surface of a sheet-like resin base material and then patterning the metal foil into a desired wiring shape. The collector sheet for solar cells has the following characteristics: the resin base material is a biaxially stretched sheet made by being stretched in the TD and MD directions of a biaxial stretching apparatus after being heated; from a consideration of two directional components orthogonal to each other of the wiring formed on the collector sheet for solar cells, the total length of first directional components of the two directional components of the wiring is made longer than the total length of second directional components of the two directional components of the wiring to impart anisotropy to the wiring; the orientation of the first directional components agrees with the orientation of the MD direction of the stretched resin base material.

(2) The present invention is also the collector sheet for solar cells according to the above (1) in which each wiring piece of the wiring is shaped into a comb, in which the orientation of the length of the tooth portions of the comb-shaped wiring pieces agrees with the orientation of the first directional components, and in which the orientation of the length of the back portions of the comb-shaped wiring pieces agrees with the orientation of the second directional components.

(3) The present invention is also the collector sheet for solar cells according to the above (1) or (2) in which the resin base material is a biaxially stretched polyethylene naphthalate film 12 to 250 μm thick, and presents a MD direction heat shrinkage factor of 0.2% to 1.0% as a result of having been heated at 150° C. for 30 minutes based on JIS-02318.

(4) The present invention is also a solar cell module including a component made by joining the collector sheet for solar cells according to any one of the above (1) to (3) and the electrodes of solar cell with solder.

Effects of the Invention

The present invention provides a resin collector sheet for solar cells in which occurrence of wrinkles can be prevented despite application of heat during soldering.

Figure 1:
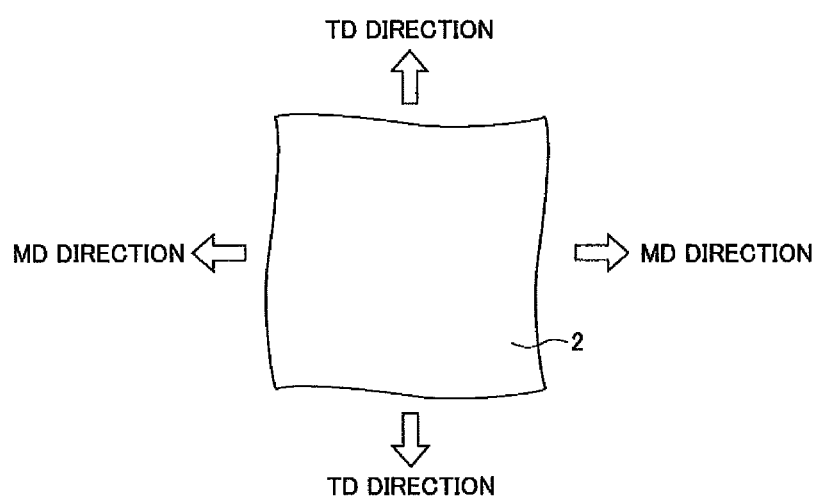
FIG. 1 is a partial plan view of a resin base material used in an embodiment of a collector sheet for solar cells according to the present invention.

EXPLANATION OF REFERENCE NUMERALS 1 collector sheet for solar cells
2 resin base material
3 wiring
4 solar cell

PREFERRED MODE FOR CARRYING OUT THE INVENTION

Figure 2:
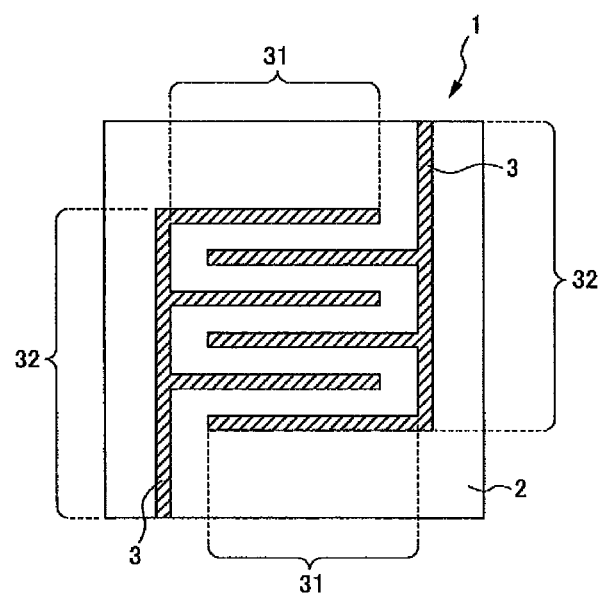
FIG. 2 is a plan view of the embodiment of the collector sheet for solar cells according to the invention.

One embodiment of a collector sheet for solar cells according to the present invention will be described below with reference to the drawings. FIG. 1 is a partial plan view of a resin base material used in the embodiment of the collector sheet for solar cells according to the invention. FIG. 2 is a plan view of the embodiment of the collector sheet for solar cells according to the invention.

The collector sheet for solar cells 1 according to this embodiment is a collector sheet on which wiring 3 is formed by laminating metal foil on a surface of the sheet-like resin base material 2 and then patterning the metal foil into a wiring shape of a comb. First, the resin base material 2 used for the collector sheet for solar cells 1 according to this embodiment will now be described.

The resin base material 2 used for the collector sheet for solar cells 1 according to the embodiment is a collector sheet made by biaxially stretching a resin molded into the shape of a sheet. As the biaxial stretching performed in the embodiment, sequential biaxial stretching using rollers and a tenter is performed by way of example.

As a method for shaping the resin into the sheet, a well-known method can be used. Examples of such a method include a method in which a resin material is melted and extruded using an extruder provided with a T-die and then the extruded resin is tightly wound around a cooling drum for cooling. By using such a method, the unstretched resin base material (resin sheet) 2 is made.

As shown in FIG. 1, the resin base material 2 thus made is biaxially stretched, i.e., is stretched in two directions (a MD direction and a TD direction) orthogonal to each other by using, for example, a sequential biaxial stretching apparatus provided with rollers and a tenter. At the time of the biaxial stretching, the resin base material 2 is heated to a temperature higher than the glass-transition temperature Tg of the base material 2, and stretched in the MD direction by use of a tensile force between the rollers of the biaxial stretching apparatus. The resin base material 2 is also stretched in the TD direction by the tenter of the biaxial stretching apparatus simultaneously with or subsequently to the MD direction stretching. Since the above sequential process is conducted while heating the resin base material 2, molecules in the resin base material 2 are arranged (oriented) along the stretching directions, and some of the molecules crystallize. Incidentally, in the present specification, as broadly known in a technical field to which the invention belongs, a lengthwise direction at the time of biaxial stretching is represented as "MD (machine direction) direction", and a crosswise direction at the time of biaxial stretching is represented as "TD (transverse direction) direction".

In general, the degree of stretching in the direction of a machine length produced by a tensile force between rollers (the degree of stretching in a MD direction) is higher than the degree of stretching in the direction of a machine width produced by a tenter (the degree of stretching in a TD direction). Therefore, in the biaxially stretched resin base material 2, a higher internal stress remains in the MD direction due to a high degree of stretching when compared with an internal stress in the TD direction. Thus a factor of heat shrinkage of the biaxially stretched resin base material 2 is generally higher in the MD direction than in the TD direction. For example, with a 50-μ-thick biaxially stretched polyethylene naphthalate (PEN) film (Teonex Q51 from Teijin DuPont Films Japan Limited) heated at 150° C. for 30 minutes based on JIS-C2318, a factor of heat shrinkage in the MD direction is 0.6%, but a factor of heat shrinkage in the TD direction is 0.1%.

Even in the case where the biaxially stretched resin base material 2 has been used like this, it is difficult to prevent the heat shrinkage caused by the heating. Therefore, when the collector sheet for solar cells 1 has been made using the resin base material 2, a shrinkage occurs, in particular, in the MD direction due to heat applied during soldering; thus wrinkles are seen. In the invention, the occurrence of such wrinkles is prevented using a method described later.

The kind of the resin to be used for the making of the resin base material 2 is not particularly limited as long as the resin has resistance to heat applied during soldering. Examples of such a resin include polyethylene naphthalate, polyimide, polyamide, polyimide amide, and polyethylene terephthalate. Of the resins described above, polyethylene naphthalate is preferred in terms of heat resistance and cost. Further, the thickness of the resin base material 2 is preferably 12 to 250 μm, more preferably 25 to 75 μm, most preferably 38 to 50 μm. A thickness below 12 μm is not preferred in terms of flatness, and a thickness above 250 μm is not preferred in terms of thermal conductivity.

The heat shrinkage factor in the MD direction of the resin base material 2 heated at 150° C. for 30 minutes based on JTS-C2318 is preferably 0.2% to 1.0%, more preferably 0.3% to 0.7%. When the heat shrinkage factor is below 0.3%, it is difficult to significantly produce the effects of the invention because the heat shrinkage factor is basically low and a change in the size of the base material 2 is, therefore, small; and besides the heat shrinkage factor above 0.7% is not preferred because wrinkles occur even when the present invention has been applied. Incidentally, the heat shrinkage factors depend on the thickness of a resin sheet, the glass-transition temperature Tg and the melting point Tm of the resin, measuring temperature, and measuring time; therefore, the measuring temperature of 150° C. and the measuring time of 30 minutes described above are nothing but examples in the case where PEN is used as the resin material. On the other hand, the heat shrinkage factor in the TD direction is generally lower than that in the MD direction, for example, is 0.2% or lower when having been measured under the same measurement conditions, and thus the heat shrinkage factor in the MD direction is higher than that in the TD direction.

Then metal foil is laminated on a surface of the resin base material 2 described above. The metal foil is used for the provision of the wiring 3 on the collector sheet for solar cells 1. Examples of such metal foil include copper foil. As a method for laminating the metal foil on the surface of the resin base material 2, any well-known lamination method can be used unless otherwise specified. Examples of such a lamination method include dry laminating using a urethane adhesive. Incidentally, the thickness of the metal foil is not particularly limited, and can, therefore, be set as appropriate in consideration of characteristics and so on necessary for the collector sheet for solar cells 1.

The metal foil laminated on the surface of the resin base material 2 is patterned into a desired shape by using a well-known method, whereby a wiring pattern (the wiring 3) is formed as electric wiring. The method for patterning the metal foil is not particularly limited; etching using photolithography can be used by way of example.

Next, the shape of the wiring 3 will now be described. In the invention, the wiring 3 has anisotropy in shape; by setting a specific orientation of the anisotropic wiring 3 on the resin base material 2, occurrence of wrinkles is prevented at the time of application of heat to the collector sheet for solar cells 1.

As shown in FIG. 2, the wiring 3 according to this embodiment includes two wiring pieces each having the shape of a comb. The comb-shaped wiring pieces 3 are provided as a pair of wiring pieces with the tooth portions 31 of the wiring pieces 3 engaged with each other. The wiring 3 is characterized by having the tooth portions 31 and back portions 32 and in that the total length of the tooth portions 31 is longer than the total length of the back portion 32. In the wiring 3, the orientation of the tooth portions 31 and the orientation of the back portions 32 are orthogonal to each other. Therefore, it is considered that the wiring 3 according to this embodiment has two directional components orthogonal to each other. The total length of first directional components of the two directional components of the wiring 3 (directional components composed of the tooth portions 3) is longer than the total length of second directional components of the two directional components of the wiring 3 (directional components composed of the back portions 32), and this produces the anisotropy.

The wiring 3 according to this embodiment is characterized in that the orientation of the first directional components (the directional components composed of the tooth portions 31) agrees with the orientation of the MD direction at the time of the stretching of the resin base material 2. By providing the wiring 3 in this way, the portions of the wiring 3 as the directional components corresponding to the MD direction of the resin base material 2 increase in density. As described earlier, in the resin base material 2, the degree of the heat shrinkage at the time of the application of the heat during the soldering is high in the MD direction. However, by providing the wiring 3 as described above, the wiring 3 having such a high density in the MD direction offers resistance to a deformation in the MD direction to prevent the shrinkage of the resin base material 2 in the MD direction. Therefore, in the collector sheet for solar cells 1, the formation of wrinkles is prevented despite the application of the heat during the soldering. That is, the collector sheet for solar cells 1 is characterized in that the formation of wrinkles is prevented despite the shrinkage of the resin base material 2 due to the application of heat at the time of the fitting of electronic parts on the surface of the collector sheet 1.

As one example, wiring 3 was formed using 35-μm-thick copper foil in a manner that has the shape of a comb shown in FIG. 2 on a biaxially stretched resin base material 2 made of a 50-μm-thick polyethylene naphthalate film and presenting a MD direction heat shrinkage factor of 0.4% as a result of having been heated at 150° C. for 30 minutes. At that time, the direction of the length of the tooth portions 31 of each comb-shaped wiring piece 3 was made to agree with the MD direction of the resin base material 2. As a result, the total length of the first directional components of the wiring 3 (directional components composed of the tooth portions 31) became longer than the total length of the second directional components of the wiring 3 (directional components composed of back portions 32); hence, the wiring 3 had anisotropy, and the orientation of the first directional components agreed with the MD direction of the resin base material 2 as described above. After the formation of the wiring 3, the collector sheet for solar cells 1 presented a MD direction heat shrinkage factor of 0.05% as a result of having been heated at 150° C. for 30 minutes. From the above, it can be seen that the factor of the MD direction heat shrinkage of the collector sheet for solar cells 1 is reduced to about one eighth when compared with that of the resin base material 2 itself. Therefore, it can be understood that the formation of wrinkles in the MD direction of the collector sheet for solar cells 1 is prevented despite the application of heat at the time of soldering for the fitting of electronic parts on the surface of the collector sheet 1.

Figure 3:
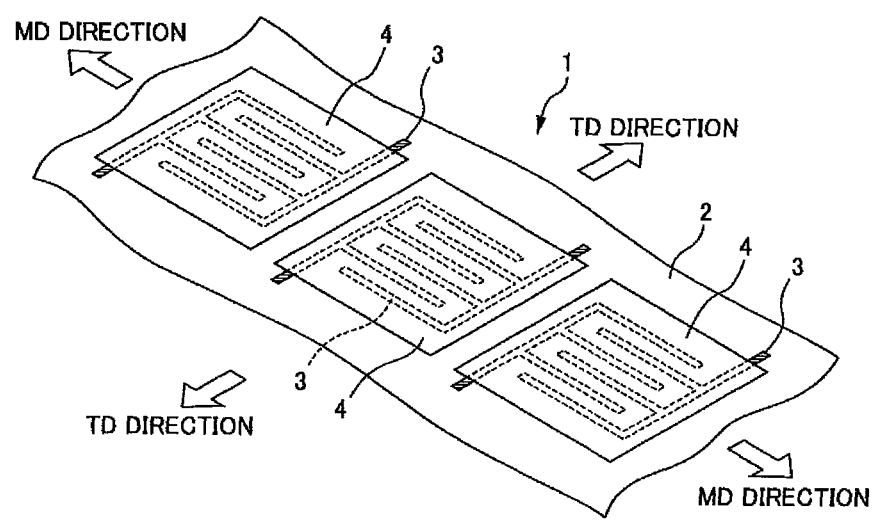
FIG. 3 is a perspective view of the embodiment of the collector sheet for solar cells according to the invention to which solar cells are joined.

The collector sheet for solar cell 1 according to this embodiment can be used preferably for the wiring of solar cells. A method for carrying out the wiring will be described below with reference to FIG. 3. FIG. 3 is a perspective view of the collector sheet for solar cells 1 according to this embodiment to which solar cells 4 are joined.

In the collector sheet for solar cells 1 according to this embodiment, the surfaces of the wiring 3 and the output electrodes of the solar cells 4 are joined together by soldering. By doing so, the collector sheet for solar cells 1 and the solar cells 4 are electrically joined together, whereby the collector sheet for solar cells 1 becomes electric wiring within a solar cell module. The electrodes of the solar cells 4 are electrodes used to output electric power generated by the solar cells 4 that received light to the outside of the solar cells 4. A material for the electrodes is not particularly limited; silver or a silver compound can be used by way of example.

As described earlier, on the collector sheet for solar cells 1 according to this embodiment, the two comb-shaped wiring pieces 3 are formed as a pair of wiring pieces. In that case, one of the pair of wiring pieces 3 is joined to a positive electrode provided on the undersurface of the solar cell 4, and the other of the pair of wiring pieces 3 is joined to a negative electrode provided on the undersurface of the solar cell 4.

To join the wiring 3 on the collector sheet for solar cells 1 and the electrodes of the solar cell 4 by soldering, the following method can be used. To begin with, solder is applied onto the electrodes of the solar cell 4 and/or the soldering points of the wiring 3 on the collector sheet for solar cells 1. Then the solar cell 4 and the collector sheet for solar cells 1 are superposed upon each other so that the positions of the electrodes of the solar cell 4 and the positions of the wiring 3 on the collector sheet for solar cells 1 agree with each other. Thereafter, the collector sheet for solar cells 1 is heated at a temperature at which the solder melts. As the solder used for the soldering, any well-known solder can be used unless otherwise specified. Examples of such solder include lead-tin alloy solder, silver-bearing solder, lead-free solder, tin-bismuth solder, and tin-bismuth-silver solder.

As described earlier, at the time of the stretching involving the heating, the resin base material 2 for the collector sheet for solar cells 1 does not heat-shrink much in the TD direction, but heat-shrinks considerably in the MD direction. Therefore, in cases where a collector sheet for solar cells made of such a resin base material has been joined to solar cells by soldering, wrinkles generally occur in the collector sheet for solar cells due to the application of heat at the time of the soldering. The occurrence of such wrinkles is not preferred from the viewpoint of a possibility that the wrinkles become a factor in producing a stress in the solar cells within a solar cell module and thus cause loss of life to the solar cell module.

On the other hand, in the collector sheet for solar cells 1 according to this embodiment, as shown in FIG. 2, each wiring piece 3 is shaped into the comb, the tooth portions 31 and the back portions 32 are orthogonal to each other, and the total length of the directional components composed of the tooth portions 31 is longer than the total length of the directional components composed of the back portions 32. Further, the orientation of the directional components composed of the tooth portions 31 of the wiring 3 agrees with the MD direction of the resin base material 2. Therefore, the wiring 3, in which the many directional components are provided in the MD direction, can prevent the MD direction heat shrinkage of the resin base material 2. As a result, deformation of the collector sheet for solar cells 1 is prevented, and occurrence of wrinkles is prevented during the soldering. The reason why the wiring 3 can prevent the heat shrinkage of the collector sheet for solar cells 1 like this is that the metal foil of which the wiring 3 is made does not heat-shrink unlike the resin base material 2.

In contrast, assume that the orientation of the directional components composed of the tooth portions 31 of FIG. 2 agrees with the TD direction of the resin base material 2, i.e., assume that a collector sheet for solar cells which the constitution of the present invention is not applied to is fabricated. In this case, the total length of the directional components of wiring that correspond to the TD direction of the resin base material becomes longer than the total length of the directional components of the wiring that correspond to the MD direction of the resin base material. Consequently, the effect of preventing deformation of the resin base material achieved by the wiring heightens more in the TD direction of the resin base material than in the MD direction. That is, the deformation-preventing effect of the wiring diminishes in the MD direction, and thus the resin base material heat-shrinks in the MD direction. Therefore, when the collector sheet for solar cells and solar cells have been joined together by soldering, wrinkles occur in the collector sheet for solar cells.

As described above, in the collector sheet for solar cells 1 according to this embodiment to which the constitution of the present invention is applied, it can be understood that occurrence of wrinkles can be prevented despite the application of heat at the time of soldering.

[Modifications]

In the above, the collector sheet for solar cells according to the present invention has been described by using the concrete embodiment; however, the invention is not limited to the above embodiment, and can, therefore, be carried out while effecting variations as appropriate without departing from the scope of the invention.

For example, in the collector sheet for solar cells 1 according to the above embodiment, the wiring pieces 3 have the shape of the comb, but there are no limitations on the shape. Even in this case, however, from a consideration of first and second directional components orthogonal to each other of the wiring 3, it is necessary to make the total length of the first directional components of the wiring 3 longer than the total length of the second directional components to impart anisotropy to the wiring 3. Further, of the orientations of both the directional components, the orientation of the directional components the total length of which is longer should be made to agree with the MD direction of the resin base material 2.

Moreover, although the collector sheet for solar cells 1 according to the above embodiment is used for the wiring of the solar cell module, there are no limitations on applications for the collector sheet for solar cells according to the invention.

Furthermore, although the resin base material 2 subjected to the sequential biaxial stretching using the rollers and the tenter is used as the collector sheet for solar cells 1 according to the above embodiment, another resin base material subjected to biaxial stretching using a different method may be used. In that case, by making a difference in heat shrinkage factor between the TD direction and the MD direction of the resin base material, the effects of the invention can be obtained.

The invention claimed is:

1. A collector sheet for solar cells comprising wiring formed by laminating metal foil on a surface of a sheet resin base material and then patterning the metal foil into a desired wiring shape,
    wherein the resin base material is a biaxially stretched sheet having a thickness of 12 µm to 250 µm made by being stretched in a TD direction, which is the width direction in the case of processing, and a MD direction, which is the length direction in the case of processing with a biaxial stretching apparatus,
    wherein, the wiring formed on the collector sheet for solar cells has each of its portions formed along either of the directions of the first and second directions components orthogonal to each other, and the total length of the portions formed along the first directional components of the wiring is made longer than the total length of the portions formed along the second directional components of the wiring to impart anisotropy to the wiring,
    an orientation of the first directional components agrees with an orientation of the MD direction of the stretched resin base material; and
    the MD direction heat shrinkage factor of the resin base material heated at 150° C. for 30 minutes is 0.2% to 1.0%.

2. The collector sheet for solar cells according to claim 1, wherein wiring pieces of the wiring are each shaped into a comb,
    an orientation of length of tooth portions of the comb-shaped wiring pieces agrees with the orientation of the first directional components, and
    an orientation of length of back portions of the comb-shaped wiring pieces agrees with an orientation, of the second directional components.

3. The collector sheet for solar cells according to claim 1 or 2, wherein the factor of MD direction heat shrinkage of the collector sheet heated at 150° C. for 30 minutes is 0.05% or less.

4. A solar cell module comprising a component made by joining the collector sheet for solar cells according to any one of claim 1 or 2 and electrodes of solar cell elements with solder.

* * * * *